(12) United States Patent
Seo

(10) Patent No.: US 9,222,167 B2
(45) Date of Patent: Dec. 29, 2015

(54) SPUTTERING APPARATUS

(71) Applicant: Samsung Display Co., Ltd., Yongin, Gyeonggi-Do (KR)

(72) Inventor: Jin-Weon Seo, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/027,174

(22) Filed: Sep. 14, 2013

(65) Prior Publication Data

US 2014/0238848 A1    Aug. 28, 2014

(30) Foreign Application Priority Data

Feb. 28, 2013   (KR) .................. 10-2013-0022381

(51) Int. Cl.
*C23C 14/24*   (2006.01)
*C23C 14/34*   (2006.01)
*H01J 37/32*   (2006.01)
*C23C 14/50*   (2006.01)

(52) U.S. Cl.
CPC ............... *C23C 14/34* (2013.01); *C23C 14/50* (2013.01); *C23C 14/505* (2013.01); *H01J 37/32715* (2013.01)

(58) Field of Classification Search
CPC .. H01J 37/32715; C23C 14/50; C23C 14/505
USPC ........................................ 204/298.15, 298.11
See application file for complete search history.

(56) References Cited

U.S. PATENT DOCUMENTS

| | | | |
|---|---|---|---|
| 6,051,113 A * | 4/2000 | Moslehi ................... | 204/192.12 |
| 6,086,727 A * | 7/2000 | Pinarbasi ................. | 204/192.11 |
| 2010/0108504 A1* | 5/2010 | Chen et al. ............... | 204/298.15 |
| 2010/0133090 A1* | 6/2010 | Endo et al. ............... | 204/192.15 |

FOREIGN PATENT DOCUMENTS

| KR | 10-2005-0090723 A | 9/2005 |
| KR | 10-2006-0044320 A | 5/2006 |
| KR | 10-2007-0120928 A | 12/2007 |
| KR | 10-2009-0091031 A | 8/2009 |

* cited by examiner

*Primary Examiner* — Jason M Berman
(74) *Attorney, Agent, or Firm* — Robert E. Bushnell, Esq.

(57) ABSTRACT

A sputtering apparatus for depositing a material on a substrate through a sputtering process includes a vacuum chamber, a target positioned in the vacuum chamber and capable of sputtering a material to be deposited, a first plate attached for a substrate to be coupled thereto or decoupled therefrom and installed to be rotated in the vacuum chamber for the substrate to face the target, and a second plate installed to be rotated in the vacuum chamber to face the target.

10 Claims, 3 Drawing Sheets

SPUTTERING APPARATUS

CLAIM OF PRIORITY

This application claims priority under 35 U.S.C. §119 of Korean Patent Application No. 10-2013-0022381 filed in the Korean Intellectual Property Office on Feb. 28, 2013, the entire contents of which are incorporated herein by reference.

BACKGROUND OF THE INVENTION

1. Field of the Invention

The present invention generally relates to a sputtering apparatus, and more particularly, to a sputtering apparatus including rotatable plates.

2. Description of the Related Art

In a case of chemical vapor deposition (CVD), dry etching, and vacuum deposition cluster tools, such as an sputtering apparatus and an etching equipment, glass is inserted after equipment PM (preventive maintenance) and then a chamber atmosphere for performing a process is formed (hereinafter referred to a back-up).

Particularly, in the case of sputtering, after replacing a target and a mask shield, in order to remove an oxide layer of the target surface and to exhaust a gas, pre-sputtering is usually performed by using 40-100 sheets of pre-sputtering glass.

At this time, for equipment back-up, by performing the pre-sputtering by using a sufficient number of pre-sputtering glass sheets, it is important to obtain sheet resistance and particles of a desired film quality.

Also, it is preferable to avoid any setback in manufacturing operations by maximizing an equipment operation rate by minimizing operation downtime of the equipment.

However, by inserting a large amount of the pre-sputtering glass for each PM, a large amount of maintaining cost is required.

Also, when performing the back-up, the production to perform the pre-sputtering and the back-up are simultaneously performed such that the equipment operation idle time is generated during the insertion of the pre-sputtering substrate, such that the operation rate is deteriorated, and on the other hand, to minimize the deterioration of the operation rate, the back-up is delayed.

The above information disclosed in this Background section is only for enhancement of understanding of the background of the invention and therefore it may contain information that does not form the prior art that is already known in this country to a person of ordinary skill in the art.

SUMMARY OF THE INVENTION

An embodiment of the present invention provides a sputtering apparatus for improving an equipment operation rate.

According to the present invention, a sputtering apparatus includes a vacuum chamber, a target positioned in the vacuum chamber and capable of sputtering material from a surface of the target, a first plate disposed in the vacuum chamber, a substrate mounted on the first plate configured to face the surface of the target and to be moved away from the surface of the target by rotation of the first plate with reference to a first axis, and a second plate disposed in the vacuum chamber and configured to face the surface of the target and to move away from the surface of the target by rotation of the second plate with reference to a second axis.

A stage provided in the vacuum chamber may be further included, and each first plate and second plate may be installed on a surface of the stage. Each first axis and second axis is substantially parallel to the surface of the stage, and each first plate and second plate is configured to face the surface of the stage and to move away from the surface of the stage by rotation of the first plate and the second plate with reference to the first axis and the second axis, respectively.

The second plate is interposed between the first plate and the stage, when each first plate and second plate is disposed substantially parallel to the surface of the stage.

The stage may be configured to be rotatable with reference to a third axis perpendicular to the surface of the stage.

A plane surface including the first axis of the second axis may be substantially parallel to the surface of the target.

The first axis and the second axis may be parallel to each other.

The first axis and the second axis are perpendicular to each other.

The second plate may be formed of one of a metal and a ceramic.

The second plate may be replaceable.

The sputtering apparatus according to an embodiment of the present invention applies the substrate unit for the pre-sputtering to perform the pre-sputtering on the substrate such that deterioration of an equipment operation rate due to the glass insertion may be prevented.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE EMBODIMENTS

Figure 1:
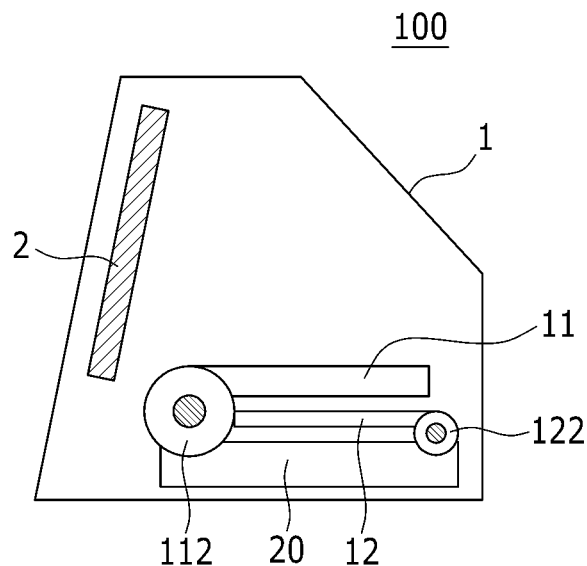
FIG. 1 is a schematic view of a sputtering apparatus constructed as an embodiment according to the principles of the present invention.

Hereinafter, embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Next, a sputtering apparatus constructed as an embodiment according to the principles of the present invention will be described with reference to accompanying drawings.

Figure 2:
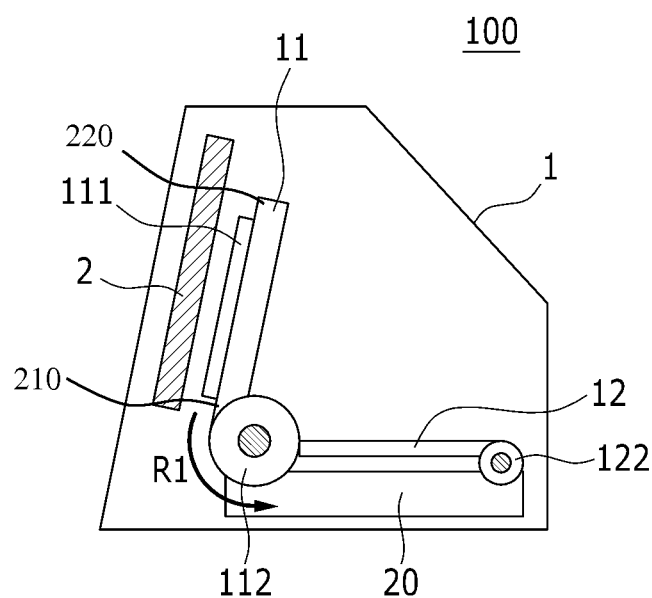
FIG. 2 is a view schematically illustrating a first operation of the sputtering apparatus of FIG. 1.
Figure 3:
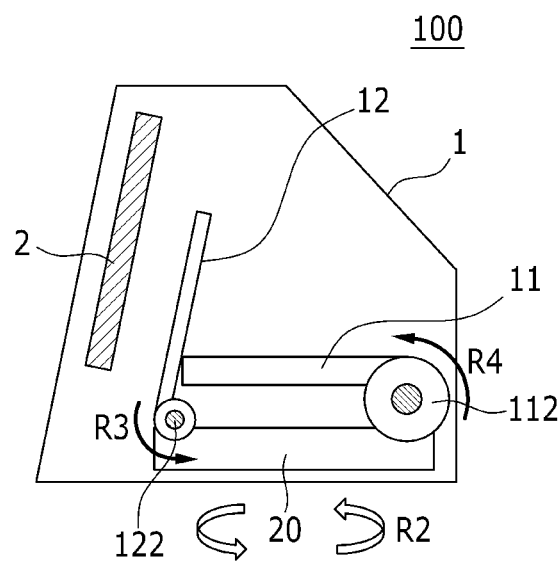
FIG. 3 is a view schematically illustrating a second operation of the sputtering apparatus of FIG. 1.

FIG. 1 is a schematic view of a sputtering apparatus constructed as an embodiment according to the principles of the present invention. FIG. 2 is a view schematically illustrating a first operation of the sputtering apparatus of FIG. 1. FIG. 3 is a view schematically illustrating a second operation of the sputtering apparatus of FIG. 1.

A sputtering apparatus constructed as an embodiment according to the principles of the present invention for depositing a material on a substrate by a sputtering process may include a pre-sputtering unit installed inside a sputter chamber, and thus, pre-sputtering may be continuously performed during a back-up after main sputtering.

Referring to FIG. 1 to FIG. 3, a sputtering apparatus 100 constructed as an embodiment according to the principles of the present invention may include a chamber 1, a target 2, a stage 20, a first plate 11, and a second plate 12.

As shown in FIG. 1, the target 2, the stage 20, the first plate 11, and the second plate 12 are accommodated inside the chamber 1 which is maintained in a vacuum state during a sputtering process.

In FIG. 1, the chamber 1 is formed with a polygon shape. However, the present invention is not limited thereto, and the chamber 1 may have any other suitable shapes.

The target 2 is positioned at one side of the chamber 1 and is used to sputter a material to be deposited onto a desired substrate.

In FIG. 1, the target 2 has a plane plate shape; however, it is not limited thereto.

Here, the chamber 1 and the target 2 have a comparably general structure such that a detailed description thereof is omitted.

As described above, the stage 20, the first plate 11, and the second plate 12 are installed inside the chamber 1.

The stage 20, on which the first plate 11 and the second plate 12 are installed, may be rotated in a horizontal direction.

The rotation axis of the stage 20 may be parallel to an axis perpendicular to an upper surface of the stage 20 or a bottom surface of the chamber 1.

Referring to FIG. 1 to FIG. 3, a first hinge portion 112, which couples the first plate 11 to the stage 20, is installed at one side of the stage 20. The first plate 11 may be rotated around the first hinge portion 112.

A second hinge portion 122, which couples the second plate 12 to the stage 20, is installed at another side of the stage 20. The second plate 12 may be rotated around the second hinge portion 122.

The rotation axes of first plate 11 and the second plate 12 may be parallel to each other.

Also, as shown in FIG. 1 to FIG. 3, the upper surface of the stage 20 and each upper surface of the first plate 11 and the second plate 12 may be disposed in parallel in a state in which the stage 20 is rotated by first installing the second plate 12 at the upper surface of the stage 20 and then installing the first plate 11 on the second plate 12.

Next, an operation process of a sputtering apparatus according to an exemplary embodiment of the present invention will be described in detail.

First, as described above, the first plate 11 is hinged and coupled to the stage 20 by the first hinge portion 112. A substrate 111 may be attachable to/detachable from the upper surface of the first plate 11. When the substrate 111 is attached to the upper surface of the first plate 11, the substrate 111 is positioned between a first portion 210 of the first plate 11 and a second portion 220 of the first plate 11.

Referring to FIG. 2, in the state that the substrate 111 is attached to the upper surface of the first plate 11, the first plate 11 may be rotated in a direction R1 to allow the substrate 111 to face the target 2. In this case, a surface of the substrate 111, onto which the material sputtered from the target 2 will be deposited, is sustainably parallel to the surface of the target.

At this time, main sputtering is performed for the substrate 111.

Once the main sputtering is completed, after performing PM (preventive maintenance) of replacing the target 2, a back-up to obtain sheet resistance and a particle degree of a desired film quality is to be performed.

In the present invention, a pre-sputtering is performed by using the second plate 12 when performing the back-up.

As described above, the second plate 12 may be positioned under the first plate 11 and at the upper surface of the stage 20.

Also, the second plate 12 is coupled to the stage 20 to be rotated around the second hinge portion 122 formed at the side opposite to the first hinge portion 112 coupling the first plate 11 to the stage 20.

In the state in which the main sputtering is completed, as shown in FIG. 3, the stage 20 is rotated in a direction perpendicular to the upper surface of the stage 20 or the bottom surface of the chamber 1, for example, in a direction R2, such that the second hinge portion 122 is positioned close to the target 2 while the first hinge portion 112 is positioned away from the target 2.

And then, the second plate 12 is rotated around the second hinge portion 122 in a direction R3 to face the target 2.

In the state that the second plate 12 is rotated to face the target 2, the pre-sputtering is performed.

The first plate 11 is then rotated toward the stage 20 around the first hinge portion 112 in a direction R4 after removing the substrate 111.

The second plate 12 may be made of a metal or ceramic material.

Also, the second plate 12 is replaceable, and the replacement may be periodically performed.

By these constitutions, in the present invention, when performing the main sputtering, the PM, and the back-up and the pre-sputtering may be performed in a serial process such that the back-up time may be reduced, and the equipment operation rate may be improved.

As shown in FIG. 1, in the present embodiment, the first plate 11 and the second plate 12 are installed on the stage 20 and coupled to the stage 20 through the first hinge portion 112 and the second hinge portion 122, respectfully. If the first plate 11 and the second plate 12 are alternately rotated to face the target 2, they may be designed into different shapes.

Figure 4:
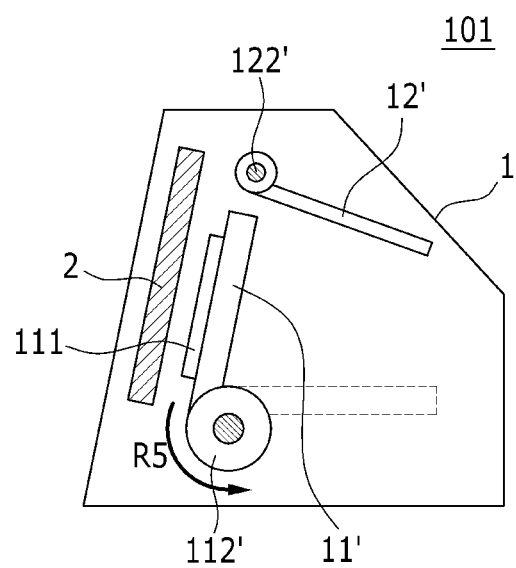
FIG. 4 is a view schematically illustrating a first operation of a sputtering apparatus constructed as another embodiment according to the principles of the present invention.
Figure 5:
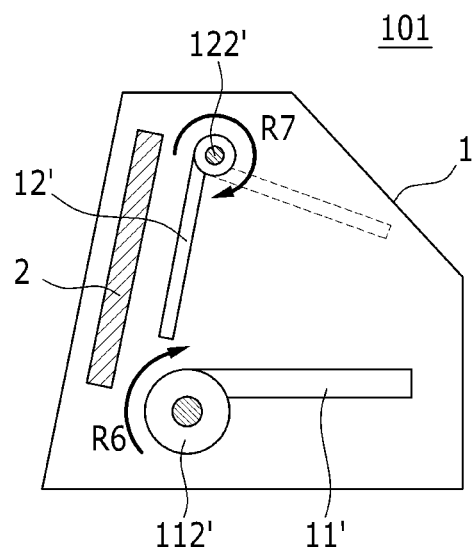
FIG. 5 is a view schematically illustrating a second operation of the sputtering apparatus of FIG. 4.

FIG. 4 is a view schematically illustrating a first operation of a sputtering apparatus constructed as another embodiment according to the principles of the present invention. FIG. 5 is a view schematically illustrating a second operation of the sputtering apparatus of FIG. 5.

Referring to FIG. 4 and FIG. 5, a sputtering apparatus 101 constructed as another embodiment according to the principles of the present invention may include a chamber 1, a target 2, a first plate 11', and a second plate 12'.

The chamber 1, the target 2, and a substrate 111 of the present embodiment are the same as the aforementioned embodiment of the present invention such that the same reference numerals will be used for the same elements and the overlapping descriptions will be omitted.

In the present embodiment, as shown in FIG. 4 and FIG. 5, a plane including the rotation axis of the first plate 11' and the second plate 12' may be positioned in front of the target 2.

At this time, the rotation axis of the first plate 11' and the second plate 12' may be disposed in parallel.

As shown in FIG. 4, first and second hinge portions 112' and 122', which respectively couples the first plate 11' and the second plate 12', may be directly installed inside the chamber 1. The first and second hinge portion 112' and 122' may be disposed near opposite ends of the target 2 and on a same side of the target 2. A plane including the first and second hinge portion 112' and 122' may be configured to be parallel to a surface of the target 2.

As described above, the substrate 111 may be coupled to or decoupled from the first plate 11', and in the state that the substrate 111 is attached to the first plate 11', the first plate 11' is rotated around the first hinge portion 112' in a direction R5 to allow the substrate 111 to face the target 2, thereby performing the main sputtering.

If the main sputtering is completed, the first plate 11' is rotated in a direction R6 so that the first plate 11' is moved away from the target 2. And then the substrate 111 is removed from the first plate 11'.

Next, as shown in FIG. 5, the second plate 12' is rotated around the second hinge portion 122' in a direction R7 to face the target 2 to perform the pre-sputtering.

Figure 6:
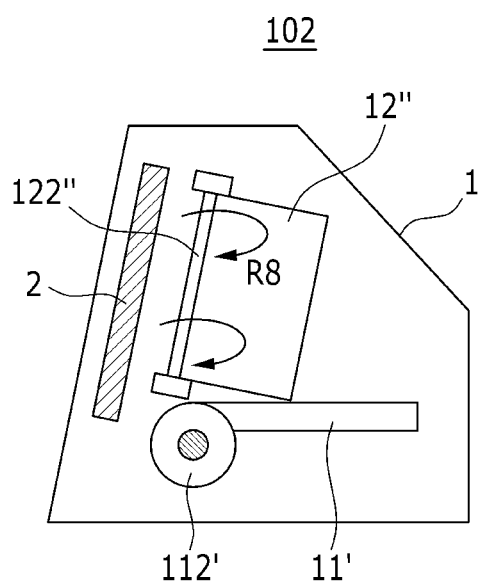
FIG. 6 is a schematic view of a sputtering apparatus constructed as a further embodiment according to the principles of the present invention.

FIG. 6 is a view of a sputtering apparatus constructed as a further embodiment according to the principles of the present invention.

Referring to FIG. 6, a sputtering apparatus 102 constructed as a further embodiment according to the principles of the present invention may include a chamber 1, a target 2, a first plate 11', and a second plate 12".

At this time, the chamber 1, the target 2, the first plate 11', and the first hinge portion 112' are the same as the previous embodiment of the present invention such that the same reference numerals will be used for the same elements and the overlapping descriptions will be omitted.

In the present embodiment, the rotation axis of the first plate 11' and a second plate 122" are disposed to be perpendicular to each other, but it is not limited thereto.

As shown in FIG. 6, the first and second hinge portions 112' and 122" may be directly installed inside the chamber 1.

In this case, the first plate 11' and a second plate 12" are installed to be separated by a predetermined interval to not cross or interfere with each other when they are rotated.

As described above, the first plate 11' may be rotated around the first hinge portion 112' to allow a substrate (not shown) to face the target 2. After the main sputtering is performed and the first plate 11' is rotated away from the target 2, the second plate 12" is rotated around the second hinge portion 122" to face the target 2. And then the pre-sputtering can be performed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of Symbols> | |
|---|---|
| 1: chamber | 2: target |
| 11: first plate | 111: substrate |
| 112, 112': first hinge portion | 12: second plate |
| 122, 122', 122": second hinge portion | 20: stage |

What is claimed is:

1. A sputtering apparatus, comprising:
   a vacuum chamber;
   a target positioned in the vacuum chamber and capable of sputtering material from a surface of the target;
   a first plate disposed in the vacuum chamber and configured to face the surface of the target and to be moved away from the surface of the target by rotation of the first plate with reference to a first axis;
   a second plate disposed in the vacuum chamber and configured to face the surface of the target and to move away from the surface of the target by rotation of the second plate with reference to a second axis different from the first axis, the first and second axes positioned at a same side of the target; and
   mechanical means positioned within the vacuum chamber for forming a first configuration in which the first plate faces the surface of the target and for reversibly exchanging the positions of the first plate and the second plate to form a second configuration in which the second plate faces the surface of the target, the first configuration and the second configuration each positioning one of the first plate and the second plate to prevent most sputtering material from reaching the other of the first plate and the second plate along a direct path from the target.

2. The sputtering apparatus of claim 1, further comprising a stage provided in the vacuum chamber,
   each first plate and second plate installed on a surface of the stage, each first axis and second axis being substantially parallel to the surface of the stage, and each first plate and second plate configured to face the surface of the stage and to move away from the surface of the stage by rotation of the first plate and the second plate with reference to the first axis and the second axis, respectively.

3. The sputtering apparatus of claim 2, wherein the second plate is interposed between the first plate and the stage, when each first plate and second plate is disposed substantially parallel to the surface of the stage.

4. The sputtering apparatus of claim 2, wherein the stage is configured to be rotatable with reference to a third axis perpendicular to the surface of the stage.

5. The sputtering apparatus of claim 4, wherein the first axis and the second axis are parallel to each other.

6. The sputtering apparatus of claim 1, wherein a plane surface including the first axis and the second axis is substantially parallel to the surface of the target.

7. The sputtering apparatus of claim 6, wherein the first axis and the second axis are parallel to each other.

8. The sputtering apparatus of claim 6, wherein the first axis and the second axis are perpendicular to each other.

9. The sputtering apparatus of claim 1, wherein the second plate is formed of one of a metal and a ceramic.

10. The sputtering apparatus of claim 1, wherein the second plate is replaceable.

* * * * *